United States Patent
Lee

(10) Patent No.: US 8,792,029 B2
(45) Date of Patent: Jul. 29, 2014

(54) PIXEL ARRAY HAVING WIDE DYNAMIC RANGE AND GOOD COLOR REPRODUCTION AND RESOLUTION AND IMAGE SENSOR USING THE PIXEL ARRAY

(71) Applicant: Siliconfile Technologies Inc., Seoul (KR)

(72) Inventor: Do-Young Lee, Seongnam-si (KR)

(73) Assignee: Siliconfile Technologies Inc., Seoul (KR)

( * ) Notice: Subject to any disclaimer, the term of this patent is extended or adjusted under 35 U.S.C. 154(b) by 0 days.

(21) Appl. No.: 13/875,773

(22) Filed: May 2, 2013

(65) Prior Publication Data

US 2013/0242147 A1    Sep. 19, 2013

Related U.S. Application Data

(62) Division of application No. 12/663,541, filed as application No. PCT/KR2007/005568 on Nov. 6, 2007, now abandoned.

(30) Foreign Application Priority Data

Jun. 18, 2007    (KR) .................. 10-2007-0059575

(51) Int. Cl.
  *H04N 3/14*    (2006.01)
  *H04N 5/335*    (2011.01)

(52) U.S. Cl.
  USPC .......................... 348/278; 348/275

(58) Field of Classification Search
  USPC .......................... 348/266, 272–280
  See application file for complete search history.

(56) References Cited

U.S. PATENT DOCUMENTS

| 7,489,352 B2 * | 2/2009 | Nakamura .................. 348/296 |
| 2004/0046883 A1 | 3/2004 | Suzuki |
| 2004/0096124 A1 | 5/2004 | Nakamura |
| 2006/0119726 A1 | 6/2006 | Oda et al. |

FOREIGN PATENT DOCUMENTS

| JP | 3-78388 | 4/1991 |
| JP | 2000-125209 | 4/2000 |
| JP | 2000-125311 | 4/2000 |
| JP | 2000-350221 | 12/2000 |
| JP | 2003-009010 | 1/2003 |
| JP | 2004-221265 | 8/2004 |
| JP | 2004-228662 | 8/2004 |
| JP | 2006-190958 | 7/2006 |
| JP | 2006-270356 | 10/2006 |
| JP | 2006270364 A * | 10/2006 |

* cited by examiner

*Primary Examiner* — Nelson D. Hernández Hernández

(74) *Attorney, Agent, or Firm* — Kile Park Reed & Houtteman PLLC

(57) ABSTRACT

Provided is a pixel array having a wide dynamic range, good color reproduction, and good resolution and an image sensor using the pixel array. The pixel array includes a plurality of first type photodiodes, a plurality of second type photodiodes, and a plurality of image signal conversion circuits. A plurality of the second type photodiodes are disposed between the first type photodiodes which are two-dimensionally arrayed. A plurality of the image signal conversion circuits are disposed between the first type photodiodes and the second type photodiodes to process image signals detected by the first type photodiodes and the second type photodiodes. An area of the first type photodiodes is wider than an area of the second type photodiodes.

2 Claims, 17 Drawing Sheets

PIXEL ARRAY HAVING WIDE DYNAMIC RANGE AND GOOD COLOR REPRODUCTION AND RESOLUTION AND IMAGE SENSOR USING THE PIXEL ARRAY

CROSS REFERENCE TO RELATED APPLICATIONS

This application is a divisional application of U.S. patent application Ser. No. 12/663,541, filed on Dec. 8, 2009 (currently pending), the disclosure of which is herein incorporated by reference in its entirety. The U.S. patent application Ser. No. 12/663,541 is a national entry of International Application No. PCT/KR2007/005568, filed on Nov. 6, 2007, which claims priority to Korean Application No. 10-2007-0059575 filed on Jun. 18, 2007, the entire contents of which are incorporated herein by reference.

BACKGROUND OF THE INVENTION

1. Field of the Invention

The present invention relates to an image sensor pixel array, and more particularly, to a pixel array having a wide dynamic range and good color reproduction and resolution and an image sensor using the pixel array.

2. Description of the Related Art

An ideal image sensor reacts to light having an intensity of 0 lux. However, a real image sensor starts reacting to light having an intensity of a predetermined lux level more than 0. A starting point where the real image sensor starts reacting is called a minimum light intensity of a pixel. A point where the light intensity increases and the image sensor does not react any more is called a maximum light intensity of a pixel.

A dynamic range is defined as a range of reactions for a relative light intensity that a system can represent. Generally, the lowest limit of the dynamic range is limited by the minimum light intensity, and the supremum is limited by the maximum light. The image sensor cannot sense and represent the light that has more than the maximum light intensity.

FIG. 1 illustrates an output voltage of a pixel corresponding to a light intensity when an exposure time of a light detector is long and short.

Referring to FIG. 1, when a light detector included in an image sensor picks up an image signal with a short exposure time, a full line A represents responses of a pixel generating a pixel output voltage Data corresponding to the image signal (light). On the other hand, when the light detector picks up an image signal with a long exposure time, a dashed dotted line B represents a pixel output voltage corresponding to the image signal.

The full line A that is a response curve when the light detector picks up the image signal with a short exposure time is represented as a linear line having a gentle slope that increases until a value Data of the pixel output voltage corresponding to the image signal is saturated (referred to as saturation point) as an intensity of the image signal increases. On the other hand, the dashed dotted line B that is a response curve when the light detector has a long exposure time is represented as a linear line having a sharp slope that increases until the value Data of the pixel output voltage corresponding to the image signal is saturated as the intensity of the image signal increases.

Referring to the full line A, when the exposure time is short, image signals corresponding to regions ①, ②, ③, and ④ can be converted into electric signals. Particularly, the image signals corresponding to the entire of the region ④ where an intensity of the image signal is high can be converted into the electrical signals. Referring to the dashed dotted line B, when the exposure time is long, image signals corresponding to the regions ①, ②, ③, and ④ can also be converted into electric signals. However, image signals having intensities corresponding to a region ⑤ that is a part of the region ④ where the intensity of the image signal is high have the same electric signals. In other words, the pixel has a disadvantage of being incapable of distinguishing the image signals having the intensities corresponding to the region ⑤ from each other. However, the pixel has an advantage of more precisely representing changes in the intensity of the image signal corresponding to the region ① where the intensity of the image signal is low.

Accordingly, when a bright image signal is converted into an electric signal, picking up the image signal with the short exposure time (referred to as A) is more preferable. On the other hand, when a dark image signal is converted into an electric signal, picking up the image signal with the long exposure time (referred to as B) is more preferable.

Conventionally, in order to increase the dynamic range, the light intensities are classified into several regions according to exposure times and photographing is performed as follows. First, image frame data that is picked up with a short exposure time is stored in a memory.

Second, image frame data that is picked up with a long exposure time is stored in a memory.

Third, the two types of the frame data which are separated from each other by the several regions as illustrated in FIG. 1 and stored in the memory are properly combined to generate new image frame data having a wide dynamic range. Here, the first photographing and the second photographing are formed with the same image but different exposure times.

When the light intensities belong to the regions ② and ③, the pixel output voltage Data can be obtained by adding an amount B taken with a long exposure time and an amount A taken with a short exposure time and can be represented by Equation 1.

$$D(②)=xA+yB$$

$$D(③)=yA+xB \qquad \text{[Equation 1]}$$

Here, D(②) represents a pixel output voltage when the light intensity belongs to the region ②, and D(③) represents a pixel output voltage when the light intensity belongs to the region ③. The sum of the variable x (x>0) and the variable y (y>0) is 1, and it is assumed that the variable x is smaller than the variable y (x<y).

Referring to Equation 1, when the light intensity belongs to the region ②, that is, it is dark (referred to as D(②)), the applied amount B taken with the long exposure time is larger than the applied amount A taken with the short exposure time. On the contrary, when the light intensity belongs to the region ③ that is brighter than the region ② (referred to as D(③)), the applied amount A taken with the short exposure time is larger than the applied amount B taken with the long exposure time.

Conventionally, the image signals are converted into electric signals by using the two pieces of photographing information having different exposure times in order to increase the dynamic range of the image sensor. However, this method has disadvantages in that photographing has to be performed two times with different exposure times, it is not easy to classify the light intensity into the regions ② and ③, and it is not easy to determine a ratio (x, y) applied to the regions ② and ③. Due to the disadvantages, application of moving images is limited.

A color filter of a general image sensor uses a Bayer pattern using RGB (red, green, and blue) colors. In this case, a range of the RGB color filter for representing colors is limited than a range sensed by a person.

FIG. 2 illustrates color coordinates using a uniform color space defined by the CIE (International Commission on Illumination) in 1976.

Referring to FIG. 2, the region a indicates a range of colors sensed by an eye of a person, and the region b indicates a range of colors represented by the RGB color filter used by the image sensor. Therefore, the region c (a shadow region) including two parts which is a difference between the regions a and b is a region that can be sensed by the eye of the person but cannot be represented by the image sensor using the RGB color filter. Therefore, the conventional image sensor using the three color filters has a problem in that a region of colors that cannot be represented exists.

SUMMARY OF THE INVENTION

The present invention provides a pixel array having a wide dynamic range, good color reproduction, and an improved resolution than a structure of a conventional pixel array.

The present invention provides an image sensor having a wide dynamic range, color reproduction that approaches a color scalability ability of a person, and an improved resolution.

According to an aspect of the present invention, there is provided a pixel array with a dynamic range comprising a plurality of first type photodiodes, a plurality of second type photodiodes, and a plurality of image signal conversion circuits. A plurality of the second type photodiodes are disposed between the first type photodiodes which are two-dimensionally arrayed. A plurality of the image signal conversion circuits are disposed between the first type photodiodes and the second type photodiodes to process image signals detected by the first type photodiodes and the second type photodiodes. An area of the first type photodiodes is wider than an area of the second type photodiodes.

According to another aspect of the present invention, there is provided a pixel array with a dynamic range including a plurality of first type photodiodes which are two-dimensionally arrayed, a plurality of second type photodiodes which are disposed between the first type photodiodes, and a plurality of image signal conversion circuits which are disposed between the first type photodiodes and the second type photodiodes to convert image signals detected by the first type photodiodes and the second type photodiodes into electric signals, wherein an area of the first type photodiodes is wider than that of the second type photodiodes, and wherein R (red) filters, G (green) filters, and B (blue) filters are disposed on the first type photodiode and the second type photodiode.

According to another aspect of the present invention, there is provided a pixel array with a dynamic range comprising a plurality of first type photodiodes which are two-dimensionally arrayed, a plurality of second type photodiodes which are disposed between the first type photodiodes, and a plurality of image signal conversion circuits which are disposed between the first type photodiodes and the second type photodiodes to convert image signals detected by the first type photodiodes and the second type photodiodes into electric signals, wherein an area of the first type photodiodes is wider than that of the second type photodiodes, wherein R filters, G filters, B filters are disposed on the first type photodiode, and wherein one or more of C (cyan) filters, M (magenta) filters, and Y (yellow) filters are disposed on the second type photodiode.

According to another aspect of the present invention, there is provided a pixel array with a dynamic range comprising a plurality of first type photodiodes which are two-dimensionally arrayed, a plurality of second type photodiodes which are disposed between the first type photodiodes, and a plurality of image signal conversion circuits which are disposed between the first type photodiodes and the second type photodiodes to convert image signals detected by the first type photodiodes and the second type photodiodes into electric signals, wherein an area of the first type photodiodes is wider than that of the second type photodiodes, wherein each of wavelength ranges of the R filters, the G filters, and the B filters is divided into at least two ranges, wherein an R1 filter covering a part of the wavelength range covered by the R filter, a G1 filter covering a part of the wavelength range covered by the G filter, and a B1 filter covering a part of the wavelength range covered by the B filter are disposed on the first type photodiode, and wherein an R2 filter covering a remaining wavelength range in the wavelength range covered by the R filter excluding the part covered by the R1 filter, a G2 filter covering a remaining wavelength range in the wavelength range covered by the G filter excluding the part covered by the G1 filter, and a B2 filter covering a remaining wavelength range in the wavelength range covered by the B filter excluding the part covered by the B1 filter are disposed on the second type photodiode.

According to another aspect of the present invention, there is provided a pixel array with a dynamic range comprising a plurality of first type photodiodes which are two-dimensionally arrayed, a plurality of second type photodiodes which are disposed between the first type photodiodes, and a plurality of image signal conversion circuits which are disposed between the first type photodiodes and the second type photodiodes to convert image signals detected by the first type photodiodes and the second type photodiodes into electric signals, wherein an area of the first type photodiodes is wider than that of the second type photodiodes, wherein R filters, G filters, B filters are disposed on the first type photodiode, and wherein infrared filters are disposed on the second type photodiode, or no color filters are disposed on the second type photodiode.

According to another aspect of the present invention, there is provided a pixel array with a dynamic range comprising a plurality of first type photodiodes which are two-dimensionally arrayed, a plurality of second type photodiodes which are disposed between the first type photodiodes, and a plurality of image signal conversion circuits which are disposed between the first type photodiodes and the second type photodiodes to convert image signals detected by the first type photodiodes and the second type photodiodes into electric signals, wherein an area of the first type photodiodes is wider than that of the second type photodiodes, wherein two types of R filters, G filters, and B filters are disposed on the first type photodiode, and wherein infrared filters are disposed on the second type photodiode, or no color filters are disposed on the second type photodiode.

DETAILED DESCRIPTION OF THE INVENTION

Hereinafter, exemplary embodiments of the present invention will be described in detail with reference to the attached drawings.

In order to increase a dynamic range, a resolution, and a color reproduction, the present invention proposes as follows:

1. a pixel array including two photodiodes having different sizes and shapes from each other;

2. an image sensor including a plurality of color filters which are arrayed on the pixel array and used together to control a dynamic range as needed and obtain color reproduction with a wider range as compared with a conventional art and a resolution that is 1.3 times as high as that of a conventional pixel array in a square shape; and 3. an adaptive image sensor which uses only limited types of color filters which are arrayed on the pixel array but does not use color filters in a predetermined area on the pixel array according to circumstances to which the image sensor is applied.

Since a photodiode is a detector that firstly detects an image signal that is externally applied, a function of the photodiode is important to the image sensor. It is well known that as a detection area of the photodiode that receives the image signal increases, a detection efficiency for the image signal also increases. Here, the detection efficiency is associated with the dynamic range described in the background art. A good detection efficiency for the image signal means that image signals having tiny differences from each other can be easily converted into electric signals corresponding to the image signals. For example, dark image signals which are applied to a plurality of the two-dimensionally arrayed photodiodes and have tiny differences from each other and bright signals having tiny differences from each other can be converted into electric signals that represent the differences. Therefore, the good detection efficiency means a wide dynamic range.

Figure 1:
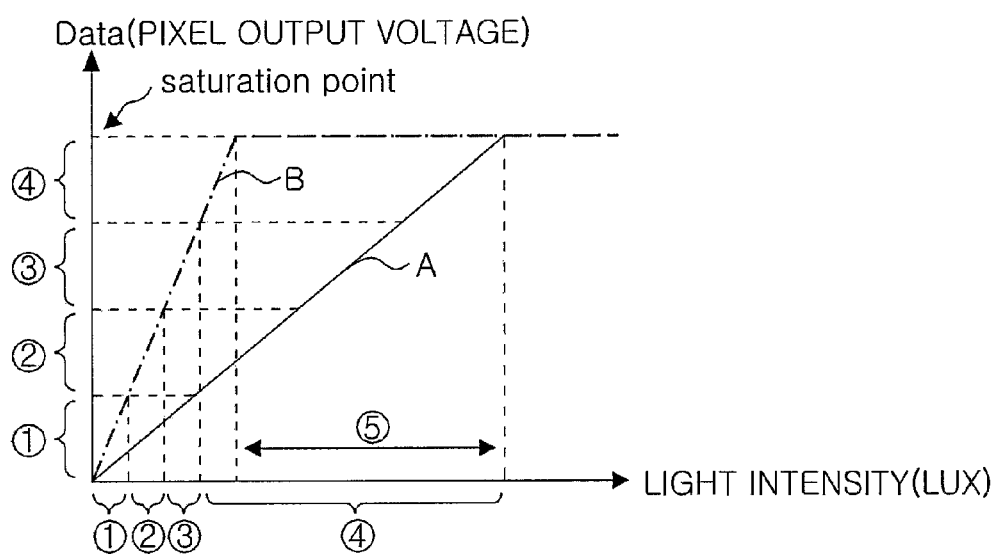
FIG. 1 illustrates an output voltage of a pixel corresponding to a light intensity when an exposure time is long and short.
Figure 2:
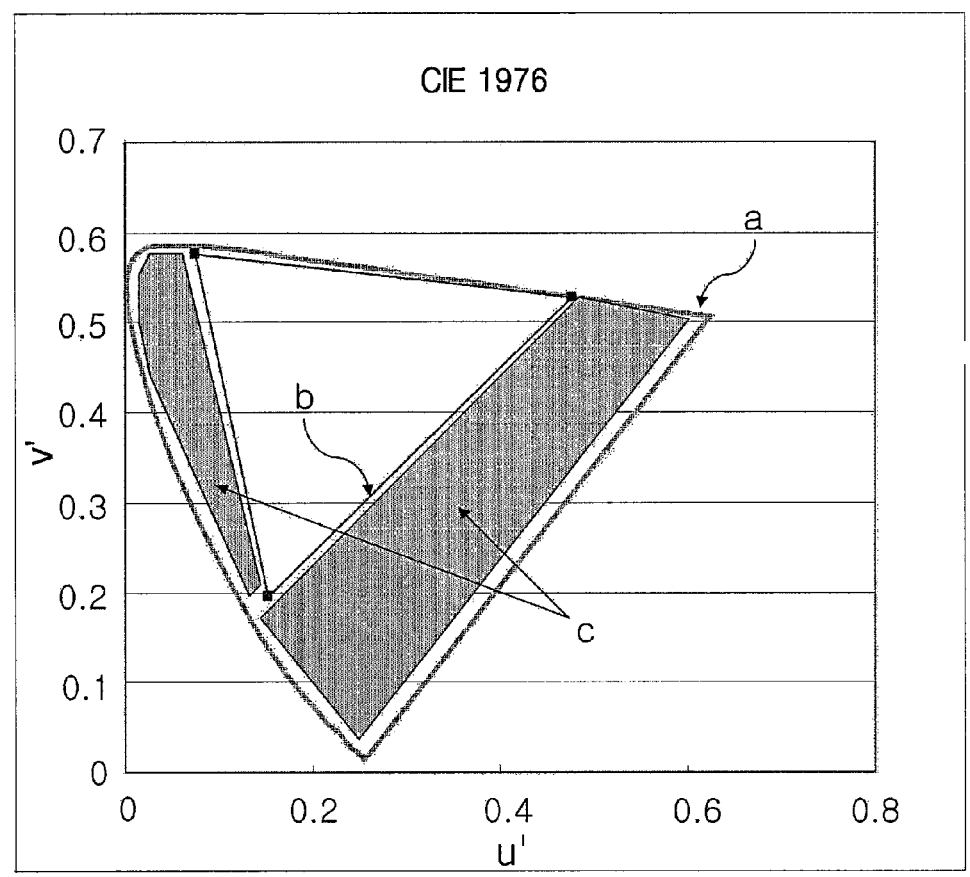
FIG. 2 illustrates color coordinates using a uniform color space defined by the CIE (International Commission on Illumination) in 1976.
Figure 3:
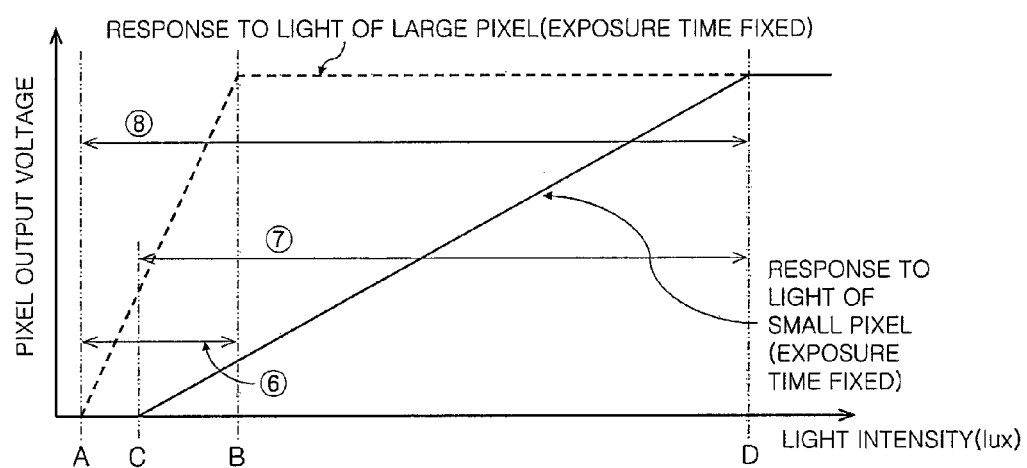
FIG. 3 illustrates pixel output voltages of a pixel having a large area and a pixel having a small area according to light intensities when exposure times of the pixels are the same.

FIG. 3 illustrates pixel output voltages of a pixel having a large area and a pixel having a small area according to light intensities when exposure times of the pixels are the same.

Referring to FIG. 3, a dotted line represents a pixel output voltage according to a light intensity when the pixel has a large area, and has a sharp slope. When the area of the photodiode is large and the light intensity is 0 lux, an output voltage corresponding to the light intensity of 0 lux is not generated. Only when the light intensity is A lux or more, an output voltage can be generated. When the light intensity increases and reaches B lux, the pixel output voltage is saturated. In this case, although the light intensity further increases, the pixel output voltage is not changed. Here, A lux and B lux correspond to a minimum light intensity and a maximum light intensity of the pixel having a large area, respectively.

On the other hand, a response curve illustrated as a full line representing a pixel output voltage according to a light intensity when an area of the pixel is small, has a gentle slope. When the area of the photodiode is small and the light intensity is 0 lux, an output voltage corresponding to the light intensity of 0 lux is not generated. Only when the light intensity is C lux or more, an output voltage can be generated. When the light intensity increases and reaches D lux, the pixel output voltage is saturated. In this case, although the light intensity further increases, the pixel output voltage is not changed. Here, C lux and D lux correspond to a minimum light intensity and a maximum light intensity of the pixel having a small area, respectively.

Referring to FIG. 3, a section ⑥ between the light intensity A and the light intensity B is an effective usage section when the pixel has a large area, and a section ⑦ between the light intensity C and the light intensity D is an effective usage section when the pixel has a small area. A section ⑧ is an effective usage section when the pixel having a large area and the pixel having a small area are simultaneously used.

A dynamic range of a digital image is defined as a ratio of a light intensity of darkest incident light to a light intensity of brightest incident light without data deterioration in an image. Particularly, in an image sensor field, the dynamic range represents a light intensity ratio of white in a totally saturated state to black in a totally dark state as a logarithm value This is represented by Equation 2 as follows.

$$\text{Dynamic Range} = 20\log\left(\frac{\text{maximum light intensity represented by a sensor}}{\text{minimum light intensity represented by a sensor}}\right) \quad [\text{Equation 2}]$$

With reference to Equation 2 and the characteristic curve illustrated in FIG. 3, a dynamic range $DR_{big}$ of a pixel having a large area, a dynamic range $DR_{small}$ of a pixel having a small area, and a dynamic range $DR_{big-small}$ when the pixel having a large area and the pixel having a small area are simultaneously used are calculated by the following Equation 3. Here, A is 0.01 lux, C is 1 lux, B is 200 lux, and D is 1000 lux.

$$DR_{big} = 20\log\left(\frac{B}{A}\right) = 20\log\left(\frac{200}{0.01}\right) = 86 \text{ dB} \quad [\text{Equation 3}]$$

$$DR_{small} = 20\log\left(\frac{D}{C}\right) = 20\log\left(\frac{1000}{1}\right) = 60 \text{ dB}$$

$$DR_{big-small} = 20\log\left(\frac{D}{A}\right) = 20\log\left(\frac{1000}{0.01}\right) = 100 \text{ dB}$$

Referring to Equation 3, it can be seen that the dynamic range $DR_{big-small}$ when the pixel having a large area and the pixel having a small area are simultaneously used is highest.

As shown in Equation 3 and FIG. 3, according to the present invention, the pixel array simultaneously using the photodiode having a large area and the photodiode having a small area to increase a dynamic range is proposed.

Figure 4:
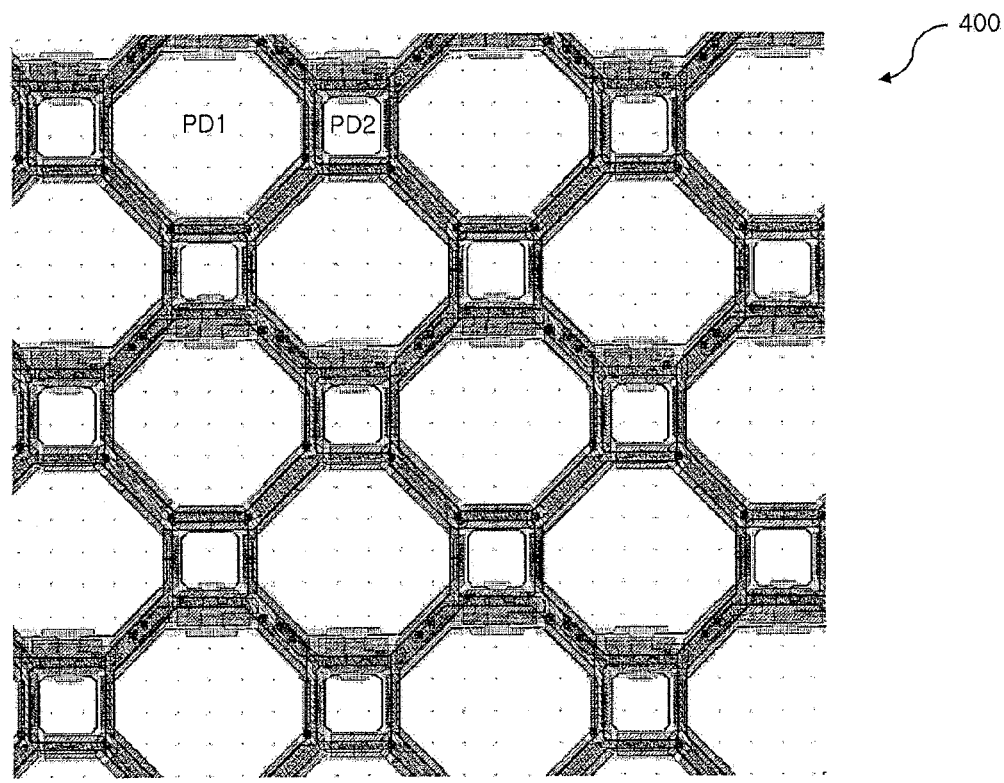
FIG. 4 illustrates a pixel array having a wide dynamic range, good resolution, and improved color reproduction.

FIG. 4 illustrates a pixel array having a wide dynamic range, good resolution, and improved color reproduction.

Referring to FIG. 4, the pixel array 400 has a structure in which two types of photodiodes PD1 and PD2 having different sizes and shapes are two-dimensionally arrayed. Here, the two types of photodiodes having different sizes and shapes are a first type photodiode PD1 which has an octagonal shape and a relatively large area and a second type photodiode PD2 having a square shape and a relatively small area.

In FIG. 4, the first type photodiodes PD1 and the second type photodiodes PD2 are alternately arrayed. However, an arrangement ratio between the two photodiodes PD1 and PD2 can be controlled according to a purpose and circumstances of a system. Although not shown precisely in FIG. 4, in spaces between the first type photodiodes and the second type photodiodes, image signal conversion circuits for converting image signals detected by corresponding photodiodes into corresponding electric signals are arranged. Structures and operations of the image signal conversion circuits are well known, so that a detailed description thereof is omitted. A layout of the photodiodes and the image signal conversion circuits are descried later in detail with reference to FIG. 16.

Referring to FIG. 4, in the pixel array according to the present invention, the first type photodiodes PD1 having an octagonal shape are arrayed. The area of the first type diode having the octagonal shape is generally the same as or larger than that of a conventional photodiode having a square shape and can be smaller than that of the conventional photodiode according to cases. It is apparent that when a first type unit photodiode having an area relatively larger than that of the conventional photodiode having the square shape detects an image signal, an image signal detection efficiency of the first type unit photodiode is higher than that of the conventional unit photodiode having a relatively smaller area. In addition, in spaces between the first type photodiodes, the second type photodiodes PD2 having the square shape and an area relatively smaller than that of the first type photodiode are arrayed, so that porosity of the photodiodes to a limited area allocated to detect the image signal is increased. According to the present invention, the second type photodiodes in addition to the first type photodiodes are arrayed, so that so long as the added photodiodes are appropriately used, the pixel array structure according to the present invention can have an improved ability of detecting the image signals.

Briefly, in the pixel array according to the present invention, the first type photodiodes having the octagonal shape and the second type photodiodes having the square shape are two-dimensionally arrayed, so that the dynamic range of the image sensor can be increased. A principle in which the dynamic range of the image sensor having the aforementioned structure is increased is described with reference to Equation 2 and FIG. 3.

Hereinafter, the image sensor according to the present invention implemented by using the pixel array in which the first type photodiodes and the second type photodiodes are arrayed according to the present invention will be described.

Figure 5:
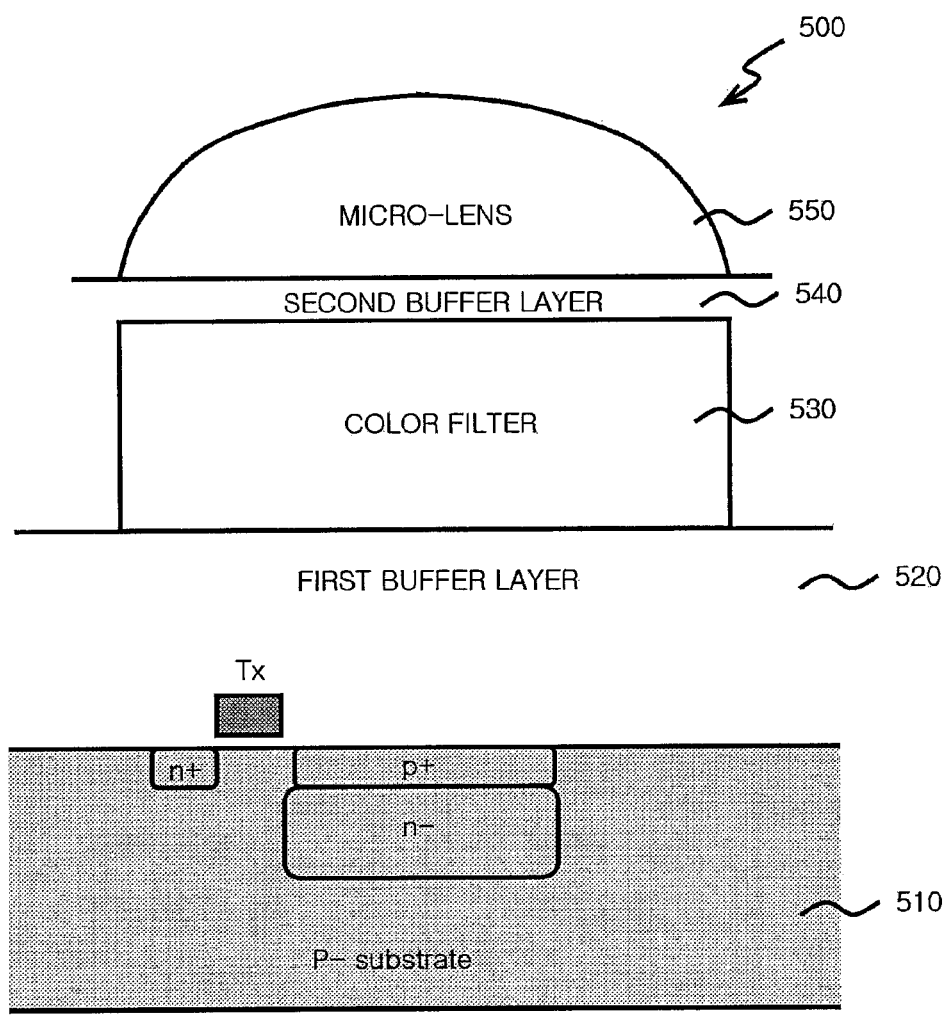
FIG. 5 illustrates a portion of a general image sensor constructed by using a pixel array and a color filter.

FIG. 5 illustrates a portion of a general image sensor constructed by using a pixel array and a color filter.

Referring to FIG. 5, the general image sensor 500 includes a photodiode 510 and first buffer layer 520, a color filter 530, a second buffer layer 540, and a micro-lens 550 formed on the photodiode 510. A vertical structure of the image sensor illustrated in FIG. 5 is well known as in a general method using a pixel array and a color filter, so that a detailed description of functions and operations of each component is omitted. Referring to FIG. 5, detection of various frequency components included in the image signal, that is, various types of color components is determined according to a type of a color filter formed on a corresponding photodiode.

As the color filter, there are a red filter (hereinafter, referred to as R filter), a green filter (hereinafter, referred to as G filter), a blue filter (hereinafter, referred to as B filter), a cyan filter (hereinafter, referred to as C filter), a magenta filter (hereinafter, referred to as M filter), and a yellow filter (hereinafter, referred to as Y filter). In addition, a new color filter set capable of improving a color representation ability can be used.

Figure 6:
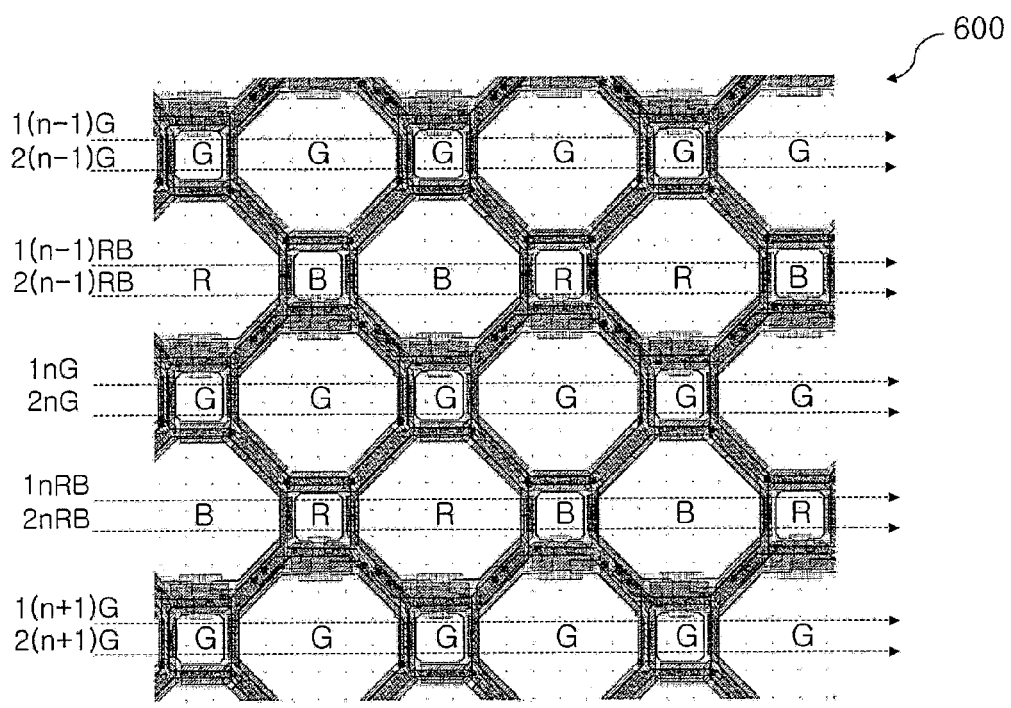
FIG. 6 illustrates an image sensor according to a first embodiment of the present invention.

FIG. 6 illustrates an image sensor according to a first embodiment of the present invention.

Referring to FIG. 6, in the image sensor 600 according to the present invention, a color filter is disposed on the pixel array 400 according to the present invention illustrated in FIG. 4. The initials R, G, and B denoted on the photodiodes in the pixel array mean that the R filter, the G filter, and B filter are disposed on corresponding photodiodes respectively.

First, color filters disposed on the first type photodiodes having the octagonal shape are described. Referring to FIG. 6, on the first type photodiodes having the octagonal shape, a plurality of 1G horizontal filter lines having a plurality of G filters (denoted by G) that are horizontally arrayed in a line are two-dimensionally arrayed. In addition, a plurality of 1RB horizontal filter lines having R filters (denoted by R) and B filters (denoted by B) that are horizontally and alternately arrayed are two-dimensionally arrayed thereon. In FIG. 6, a plurality of the 1G horizontal filter lines represented by dotted lines are denoted by 1(n−1)G, 1nG, and 1(n+1), and a plurality of 1RB horizontal filter lines are represented as 1(n−1)RB and 1nRB. Here, n means an integer. Referring to FIG. 6, one of the 1RB horizontal filter lines is disposed between the 1G horizontal filter lines.

Here, the number 1 is added to the front of the G and RB horizontal filter lines as represented as the 1G and 1RB horizontal filter lines. This means that the horizontal filter lines are disposed only on the first type photodiodes, and the horizontal filter lines are distinguished from horizontal filter lines disposed only on the second type photodiodes described later. According to another embodiment of the present invention described later, unless otherwise described, R filters, G filters, and B filters are arrayed on first type photodiodes included in an image sensor as illustrated in FIG. 6. Therefore, hereinafter, a description of arrangement of the R, G, and B filters on the photodiode is omitted.

Next, color filters arrayed on the second type photodiodes having the square shape are described.

Referring to FIG. 6, on the second type photodiodes, a plurality of 2G horizontal filter lines having a plurality of G filters that are horizontally arrayed in a line, are two-dimensionally and vertically arrayed in a line. Similarly, a plurality of 2RB horizontal filter lines having R filters and B filters that are horizontally and alternately arrayed in a line, are two-dimensionally and vertically arrayed in a line. Here, each of the 2RB horizontal filter lines is disposed between the 2G horizontal filter lines. A plurality of 2G horizontal filter lines are denoted by 2(n−1)G, 2nG, and 2(n+1), and a plurality of 2RB horizontal filter lines are denoted by 2(n−1)RB and 2nRB.

Referring to FIG. 6, the 1G horizontal filter lines and the 2G horizontal filter lines exist in the virtually the same line. Similarly, the 1RB horizontal filter lines and the 2RB horizontal filter lines exist in the virtually the same line. This is because seen from above, the first type photodiodes and the second type photodiodes of the image sensor illustrated in FIG. 6 are alternately arrayed, and the color filters are disposed on the photodiodes. A concept of the horizontal filter line described above is similarly applied to the description provided later.

Figure 7:
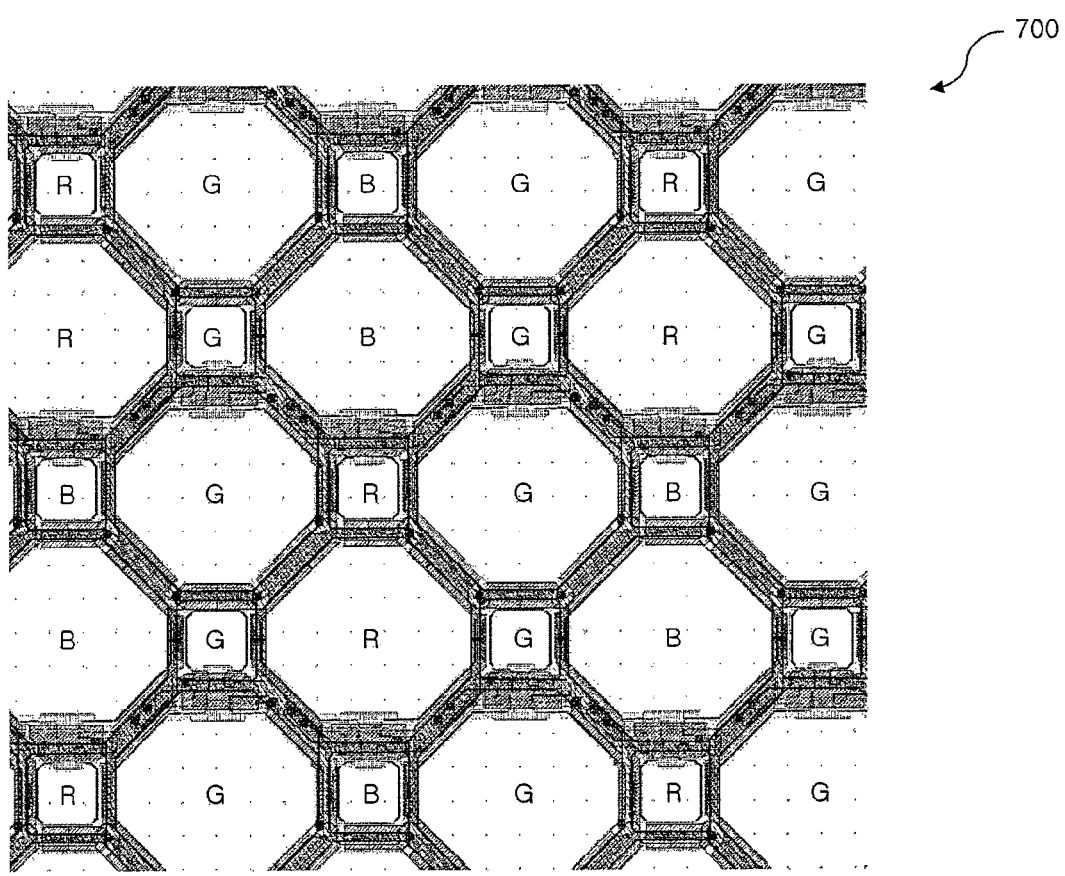
FIG. 7 illustrates an image sensor according to a second embodiment of the present invention.

FIG. 7 illustrates an image sensor according to a second embodiment of the present invention.

First type photodiodes, and a plurality of 1G horizontal filter lines and a plurality of 1RB horizontal filter lines disposed on the first type photodiodes included in the image sensor 700 illustrated in FIG. 7 are the same as those illustrated in FIG. 6. However, the image sensor 700 illustrated in FIG. 7 is different from the image sensor 600 illustrated in FIG. 6 in that 2G horizontal filter lines disposed on second type photodiodes are aligned with a plurality of 1RB horizontal filter lines in virtually the same line, and 2RB horizontal filter lines are aligned with a plurality of 1G horizontal filter lines in the virtually the same line.

Figure 8:
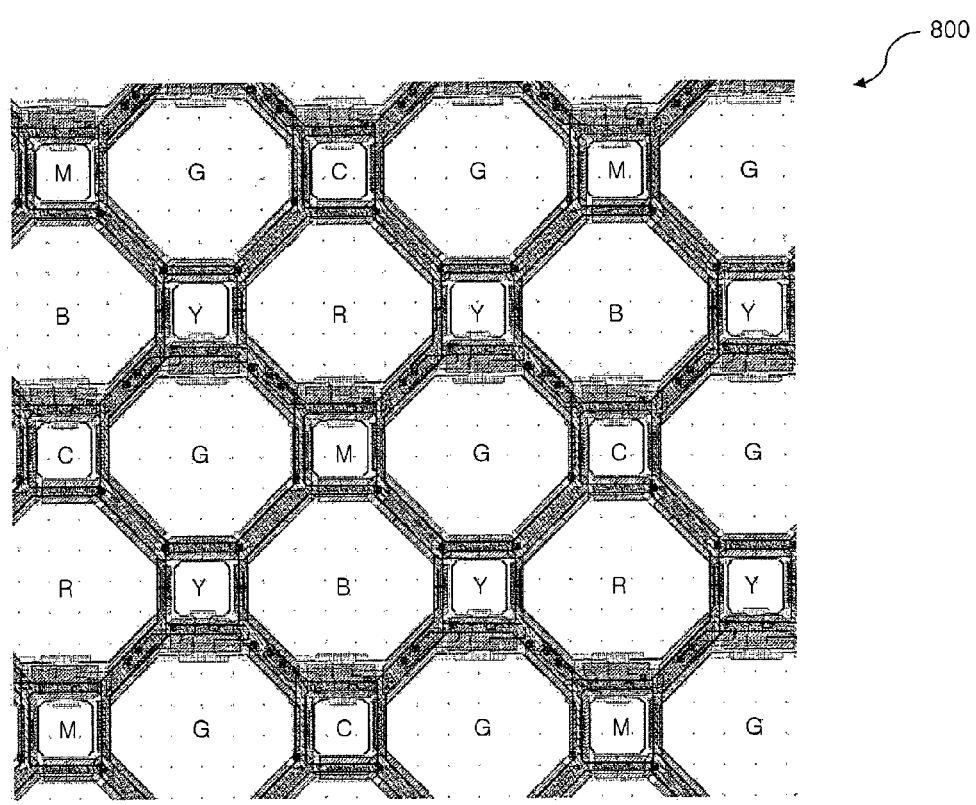
FIG. 8 illustrates an image sensor according to a third embodiment of the present invention.

FIG. 8 illustrates an image sensor according to a third embodiment of the present invention.

Referring to FIG. 8, first type photodiodes, and a plurality of 1G horizontal filter lines and a plurality of 1RB horizontal filter lines disposed on the first type photodiodes included in the image sensor 800 illustrated in FIG. 8 are the same as those illustrated in FIG. 6. However, the image sensor 800 illustrated in FIG. 8 is different from the image sensor 600 illustrated in FIG. 6 in that a plurality of 2MC horizontal filter lines including M filters and C filters that are horizontally and alternately arrayed in a line are vertically arrayed on the second type photodiodes, and each of the 2MC horizontal filter lines is aligned with the 1G horizontal filter line in virtually the same line. In addition, a plurality of 2Y horizontal filter lines including a plurality of Y filters that are horizontally arrayed in a line are vertically arrayed on the second type photodiodes, and each of the 2Y horizontal filter lines is aligned with the 1BR horizontal filter line in virtually the same line.

Figure 9:
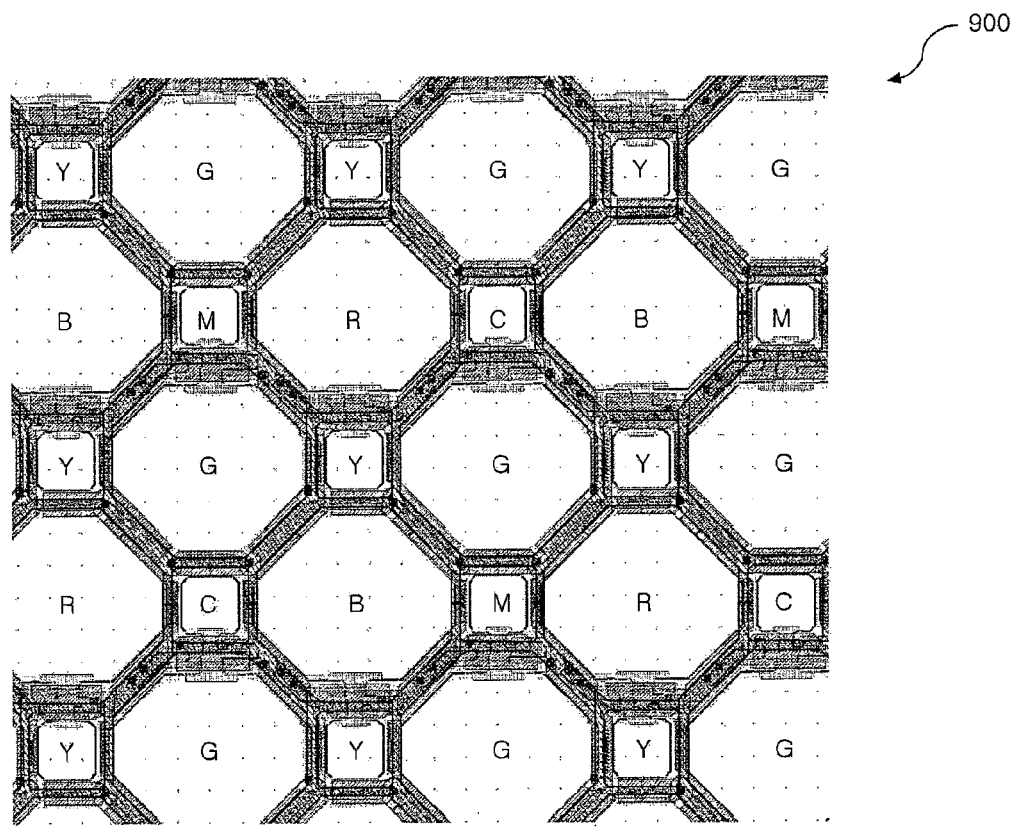
FIG. 9 illustrates an image sensor according to a fourth embodiment of the present invention.

FIG. 9 illustrates an image sensor according to a fourth embodiment of the present invention.

Referring to FIG. 9, the image sensor 900 is different from the image sensor 800 illustrated in FIG. 8 in that positions of a plurality of the 2MC horizontal filter lines are exchanged with positions of a plurality of the 2Y horizontal filter lines, and other components are the same.

Referring to FIGS. 8 and 9, in the image sensor according to the present invention, the R, G, and B filters are disposed on the first type photodiode, and the C, M, and Y filters are disposed on the second type photodiode.

Hereinafter, a fact that MCY color filters that is, magenta, cyan, and yellow filters in addition to the RGB color filters are used to increase color reproduction is described.

Figure 10:
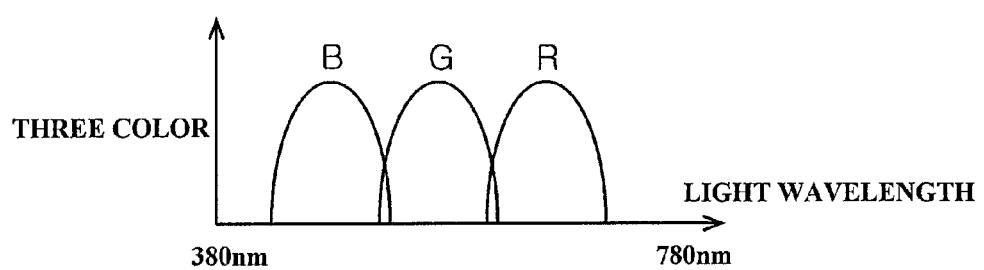
FIG. 10 illustrates transmission filtering characteristics according to wavelengths of an image sensor.
Figure 10:
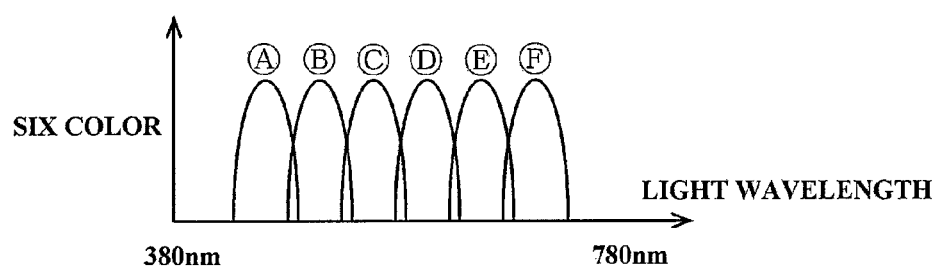

FIG. 10 illustrates transmission filtering characteristics according to wavelengths of an image sensor.

Referring to FIG. 10, transmission filtering characteristics according to wavelengths of light when three color filters (referred to as RGB) and six color filters (referred to as ⓐⓑⓒⓓⓔⓕ) are used are illustrated. Here, a range of wavelengths covered by the B color filter is divided into ranges of wavelengths covered by the two color filters ⓐⓑ from among the six color filters ⓐⓑⓒⓓⓔⓕ, a range of wavelengths covered by the G color filter is divided into ranges of wavelengths covered by the two color filters ⓒⓓ, and a range of wavelengths covered by the R color filter is divided into ranges of wavelengths covered by the two color filters ⓔⓕ.

Figure 11:
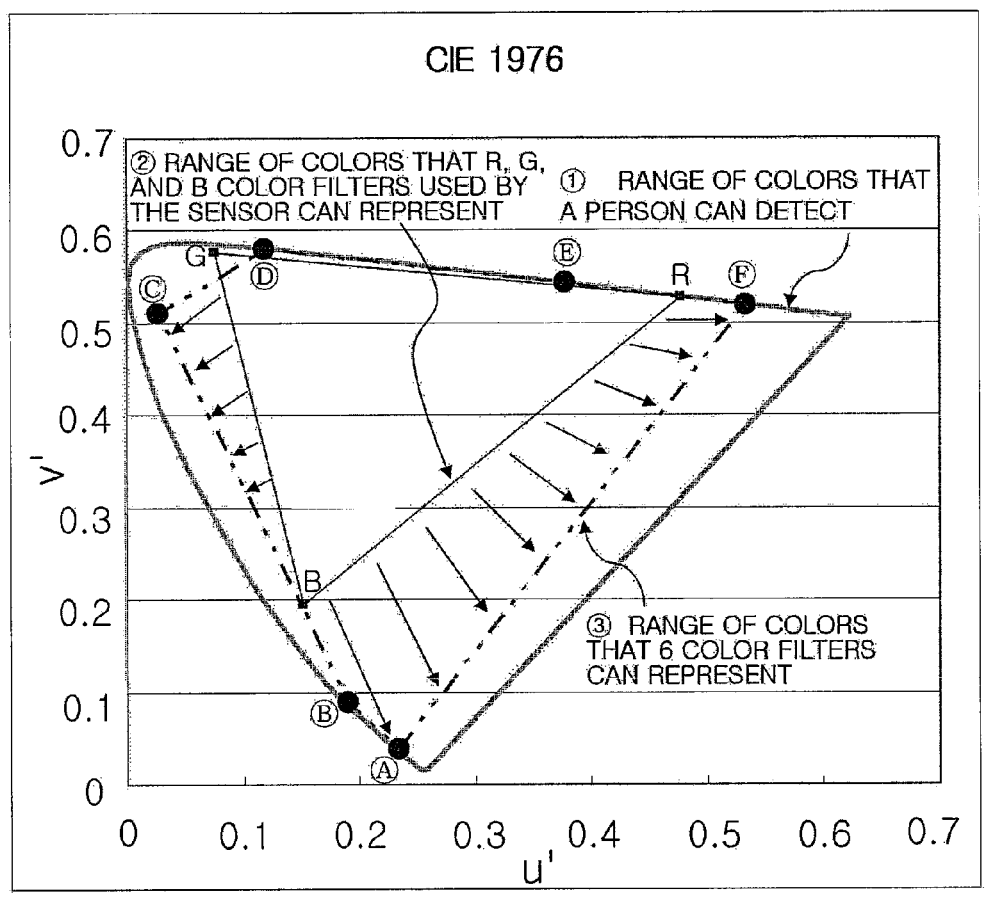
FIG. 11 illustrates color coordinates when six color filters are used.

FIG. 11 illustrates color coordinates when six color filters are used.

Referring to FIG. 11, when the six color filters ⓐⓑⓒⓓⓔⓕ are applied to the image sensor according to the present invention instead of the three color filters RGB, it can be seen that colors in a six-sided region represented by a two-dot chain line can be represented, so that a wider color representation range can be obtained as compared with colors in a triangular region represented by the RGB color filters.

Figure 12:
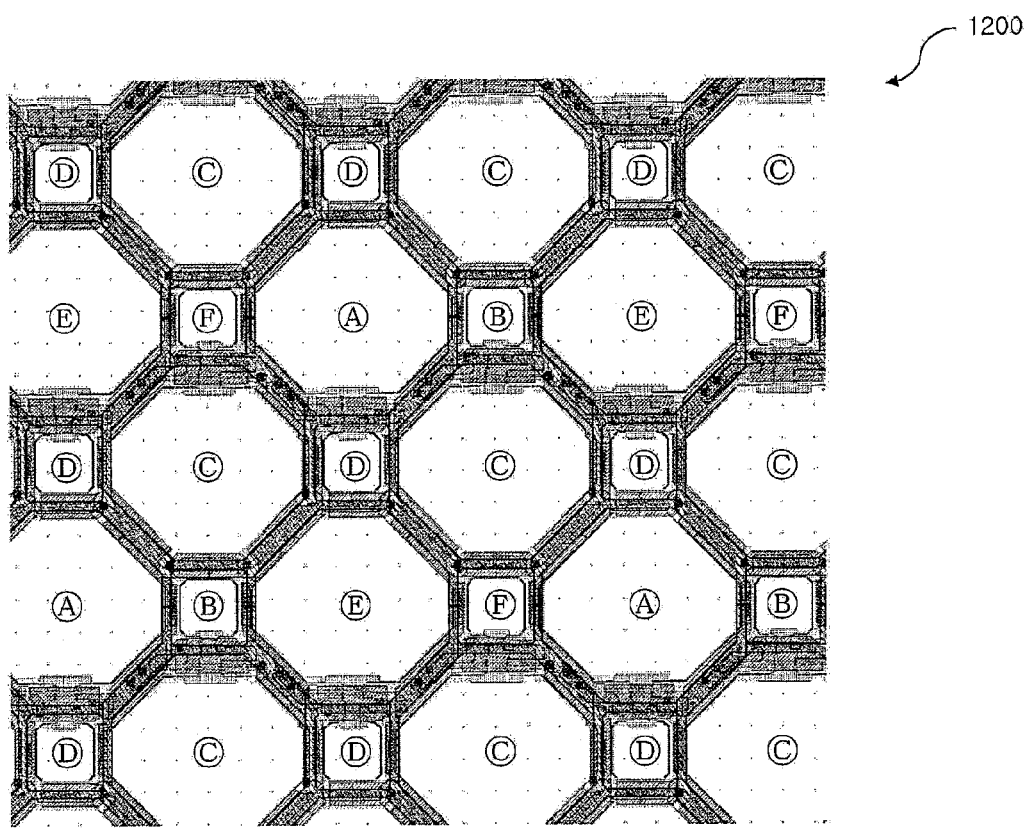
FIG. 12 illustrates an image sensor according to a fifth embodiment of the present invention.

FIG. 12 illustrates an image sensor according to a fifth embodiment of the present invention.

Referring to FIG. 12, in the image sensor 1200 according to the present invention, the three color filters ⓐⓒⓔ illustrated in FIG. 10 are arrayed in a Bayer pattern on the first type photodiode, and the remaining three color filters ⓑⓓⓕ are arrayed on the second type photodiode. As illustrated in FIG. 12, the number of the color filters ⓒⓓ corresponding to greed-based colors may be twice the number of other color filters.

Figure 13:
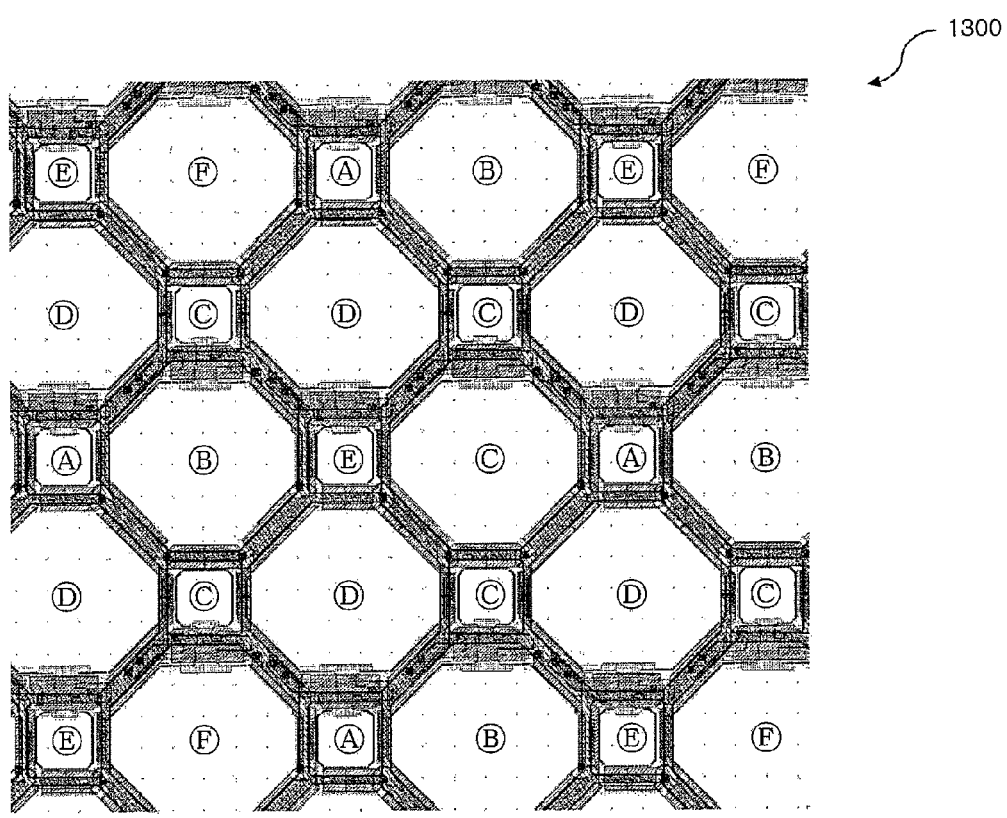
FIG. 13 illustrates an image sensor according to a sixth embodiment of the present invention.

FIG. 13 illustrates an image sensor according to a sixth embodiment of the present invention.

Referring to FIG. 13, in the image sensor 1300 according to the present invention, the three color filters ⓑⓓⓕ are arrayed in a Bayer pattern on the first type photodiode, and the three color filters ⓐⓒⓔ are arrayed on the second type photodiode. In addition, similarly as illustrated in FIG. 12, the number of the color filters ⓒⓓ corresponding to the green-based colors may be twice the number of other color filters.

In FIGS. 12 and 13, the wavelength range covered by each of the R filter, the G filter, and the B filter is divided into two ranges so that six filters are obtained. However, the range may be divided into two or more ranges so that the number of filers is a multiple of 3.

Figure 14:
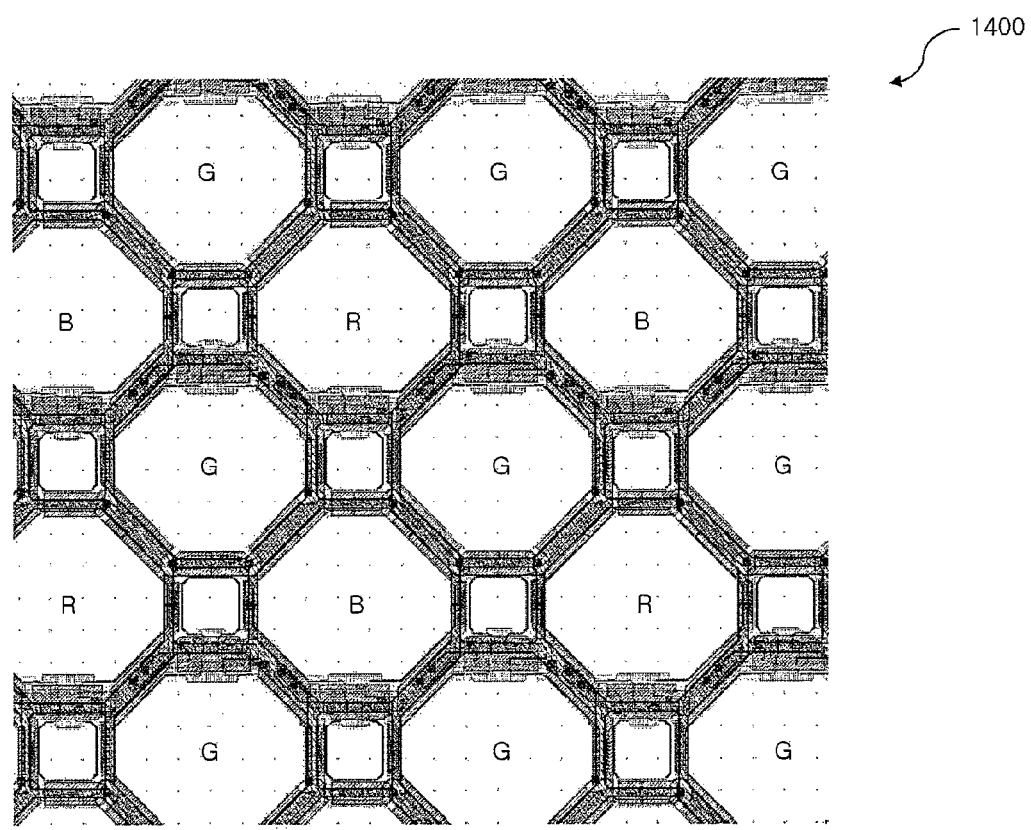
FIG. 14 illustrates an image sensor according to a seventh embodiment of the present invention.

FIG. 14 illustrates an image sensor according to a seventh embodiment of the present invention.

Referring to FIG. 14, in the image sensor 1400 according to the present invention, the R filters, the G filters, and the B filters are arrayed on the first type photodiode, and no color filters are arrayed on the second type photodiode. Otherwise, an infrared filter is disposed on the second type photodiode.

When no color filters are arrayed on the second type photo diode, the second photodiode detects black and white components included in an image signal. When the infrared filter is disposed on the second type photodiode, the second type photodiode detects infrared components included in the image signal. Therefore, in the image sensor 1400 illustrated in FIG. 14, the first type photodiode detects color components included in the image sensor, and the second type photodiode detects black and white components or infrared components included in the image sensor.

Figure 15:
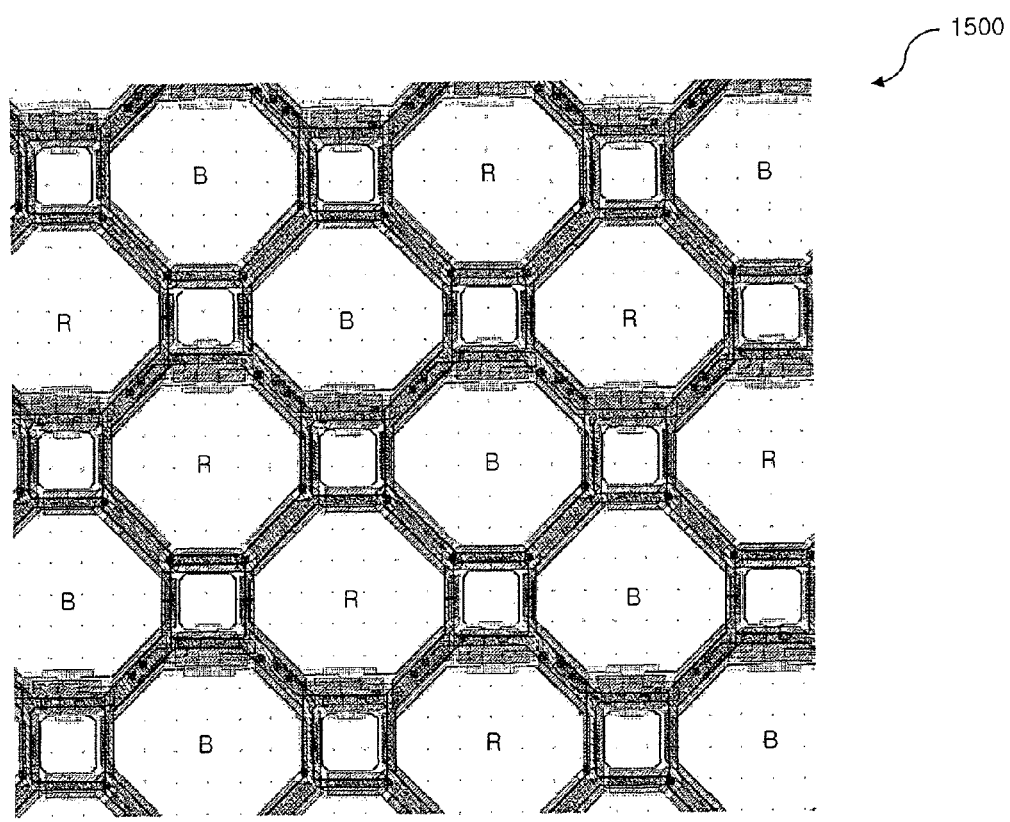
FIG. 15 illustrates an image sensor according to an eighth embodiment of the present invention.

FIG. 15 illustrates an image sensor according to an eighth embodiment of the present invention.

Referring to FIG. 15, in the image sensor 1500, only R filters and B filters are arrayed on the first type photodiodes, and the G filters are not arrayed. Seen from above, the R filters and the B filters are alternately arrayed. In addition, no color filters are disposed on the second photodiodes, or the infrared filters, the R filters, the G filters, or the B filters may be disposed thereon. FIG. 15 illustrates that there are no G filters on the first type photodiodes. However, according to cases, the R filters or the B filters may not exist thereon.

Referring to FIG. 15, the image sensor 1500 has advantages in that according to a purpose and an object, the first type photodiode detects two types of color components that are properly selected, and the second type photodiode detects the black and white components, infrared components, and other types of color components that are selected properly.

Figure 16:
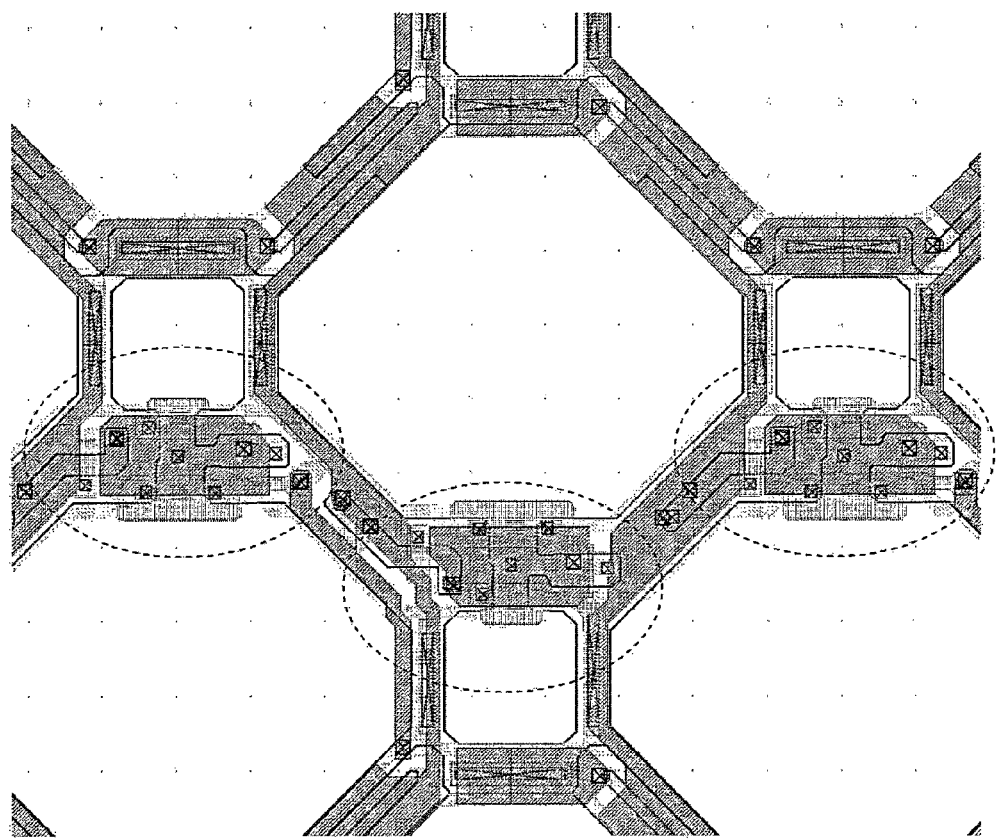
FIG. 16 illustrates a portion of a pixel array according to the present invention.

FIG. 16 illustrates a portion of a pixel array according to the present invention.

Referring to FIG. 16, the pixel array include the photodiodes having the octagonal shape, the photodiodes having the square shape, and the image signal conversion circuits represented by the dotted lined circle.

Figure 17:
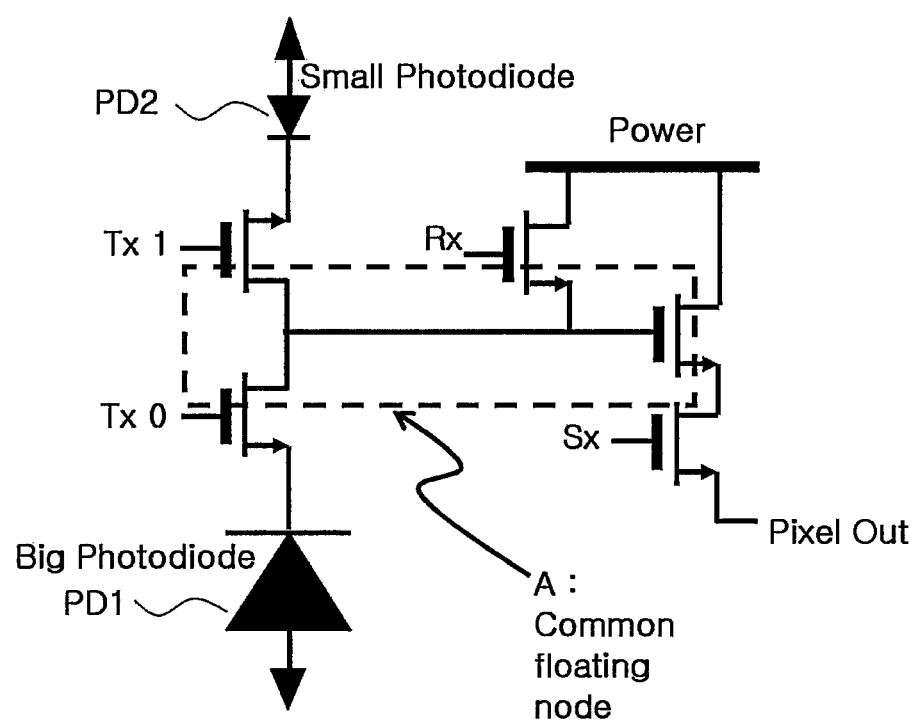
FIG. 17 illustrates an image signal conversion circuit of a unit pixel associated with the pixel array according to the present invention illustrated in FIG. 16.

FIG. 17 illustrates an image signal conversion circuit of a unit pixel associated with the pixel array according to the present invention illustrated in FIG. 16.

Referring to FIG. 17, the image signal conversion circuit for converting charge detected by the large photodiode PD1 having the octagonal shape and the small photodiode PD2 having the square shape into electric signals is shared to be used. As described above, the pixel having a large area and the pixel having a small area are disposed in an array and have correlations therebetween, so that there is an advantage in that variables created by the image signal conversion circuit for converting the charge generated by the photodiodes into the electric signals can be reduced. In addition, since the small pixel PD2 and the large pixel PD1 share a floating diffusion node (A), so that there is an advantage in that conversion efficiencies of the large pixel and the small pixel are the same.

As described above, the pixel array and the image sensor having a wide dynamic range according to the present invention have advantages in that the dynamic range can be increased, types of the color filters can be selected to increase the color representation range, and the image sensor can be applied according to environments. In addition, the pixels are arrayed in a hive pattern in addition to in a vertical and horizontal pattern, so that a resolution and a performance thereof can be improved than pixels arrayed only in the hive pattern.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A pixel array with a dynamic range comprising a plurality of first type photodiodes which are two-dimensionally arrayed, a plurality of second type photodiodes which are disposed between the first type photodiodes, and a plurality of image signal conversion circuits which are disposed between the first type photodiodes and the second type photodiodes to convert image signals detected by the first type photodiodes and the second type photodiodes into electric signals, wherein an area of the first type photodiodes is wider than that of the second type photodiodes, wherein R filters, G filters, B filters are disposed on the first type photodiode, and wherein one or more of C (cyan) filters, M (magenta) filters, and Y (yellow) filters are disposed on the second type photodiode, wherein, on the first type photodiode a plurality of 1G horizontal filter lines having a plurality of G filters which are horizontally arrayed are disposed, and a plurality of 1RB horizontal filter lines having a plurality of R filters and B filters which are alternately arrayed are disposed, wherein, on the second type photodiode, a plurality of 2Y horizontal filter lines having a plurality of Y filters which are horizontally arrayed are disposed, and a plurality of 2CM horizontal filter lines having a plurality of C filters and M filters which are horizontally and alternately arrayed are disposed, wherein a plurality of the 1G horizontal filter lines and a plurality of the 1RB horizontal filter lines are vertically and alternately arrayed, and wherein a plurality of the 2GM horizontal filter lines and a plurality of the 1G horizontal filter lines are arrayed in virtually the same line, and a plurality of the 2Y horizontal filter lines and a plurality of the 1RB horizontal filter lines are arrayed in virtually the same line.

2. A pixel array with a dynamic range comprising a plurality of first type photodiodes which are two-dimensionally arrayed, a plurality of second type photodiodes which are disposed between the first type photodiodes, and a plurality of image signal conversion circuits which are disposed between the first type photodiodes and the second type photodiodes to convert image signals detected by the first type photodiodes and the second type photodiodes into electric signals, wherein an area of the first type photodiodes is wider than that of the second type photodiodes, wherein R filters, G filters, B filters are disposed on the first type photodiode, and wherein one or more of C (cyan) filters, M (magenta) filters, and Y (yellow) filters are disposed on the second type photodiode, wherein, on the first type photodiode, a plurality of 1G horizontal filter lines having a plurality of G filters which are horizontally arrayed are disposed, and a plurality of 1RB horizontal filter lines having a plurality of R filters and B filters are horizontally and alternately arrayed are disposed, wherein, on the second type photodiode, a plurality of 2Y horizontal filter lines having a plurality of Y filters which are horizontally arrayed are disposed, and a plurality of 2CM horizontal filter lines having a plurality of C filters and M filters which are horizontally and alternately arrayed are disposed, wherein a plurality of the 1G horizontal filter lines and a plurality of the 1RB horizontal filter lines are vertically and alternately arrayed, and wherein a plurality of the 2Y horizontal filter lines and a plurality of the 1G horizontal filter lines are arrayed in virtually the same line, and a plurality of the 2CM horizontal filter lines and a plurality of the 1RB horizontal filter lines are arrayed in virtually the same line.

* * * * *